United States Patent
Fukushima

[11] Patent Number: 5,682,112
[45] Date of Patent: Oct. 28, 1997

[54] PHASE LOCKED LOOP CONTROL APPARATUS

[75] Inventor: Masaya Fukushima, Tokyo, Japan

[73] Assignee: NEC Corporation, Toyko, Japan

[21] Appl. No.: 443,703

[22] Filed: May 18, 1995

[30] Foreign Application Priority Data

May 18, 1994 [JP] Japan .................................. 6-103650

[51] Int. Cl.$^6$ .............................. H03K 7/00; H03K 5/159
[52] U.S. Cl. ........................ 327/147; 327/144; 327/156; 331/11; 331/49
[58] Field of Search ........................... 327/141, 144–150, 327/156–159, 243, 244; 331/11, 14, 49, 55

[56] References Cited

U.S. PATENT DOCUMENTS

| | | | |
|---|---|---|---|
| 3,795,872 | 3/1974 | Napolitano et al. | 331/49 |
| 4,019,143 | 4/1977 | Fallon et al. | 331/49 |
| 4,308,619 | 12/1981 | Hughes | 327/146 |
| 5,184,350 | 2/1993 | Dara | 331/49 |
| 5,355,090 | 10/1994 | Pajowski et al. | 327/144 |
| 5,373,254 | 12/1994 | Nakauchi et al. | 331/49 |
| 5,455,840 | 10/1995 | Nakauchi et al. | 327/147 |

Primary Examiner—Timothy P. Callahan
Assistant Examiner—T. T. Lam
Attorney, Agent, or Firm—Scully, Scott, Murphy & Presser

[57] ABSTRACT

The phase locked loop (PLL) control apparatus includes a selector which selects input signals, for an active system and a standby system having a clock signal and a frame pulse signal synchronized with the clock signal, by means of a line switching signal. The phase difference between the frame pulses before and after the line switching is output by a frame pulse phase comparator. On the other hand, accompanying the line switching, a frequency divided clock output from a frequency divider is branched in a PLL control circuit which carries out the phase matching of the clocks. The branched clock is converted to pseudo clocks with duty factors larger than and smaller than 50% by a duty factor controller. A clock selector which selects one out of the frequency divided clock and the pseudo clock in response to the phase difference of the frame pulses is installed between a clock phase comparator and a low-pass filter of the PLL control circuit. The provision of a time gate which is linked with the line switching signal, it is also possible to terminate the phase matching after the lapse of a specified period of time. Furthermore, it is also possible to carry out a quicker and smoother phase matching by detecting the control voltage and setting the duty factor in response to the condition of the phase difference.

17 Claims, 10 Drawing Sheets

PHASE LOCKED LOOP CONTROL APPARATUS

BACKGROUND OF THE INVENTION

1. Field of the Invention

The present invention relates to the clock extraction from a synchronous large capacity transmission system, and more particularly to a phase locked loop (PLL) control apparatus which performs the redundancy switching of the clock accompanying the line switching in a dual transmission system with an active system and a standby system.

2. Description of the Related Art

In a synchronous transmission system it is general to form the clock system within the system in dual fashion in order to constitute the system to be redundant. In switching the dual clock, it is required to affect the main signal as little as possible. Factors affecting the main signal include generally a hit of the clock accompanying the clock switching and the so-called phase jump caused by the mismatch of the clock phases.

For that reason, a PLL control apparatus adopted is ordinarily the type in which the above-mentioned influence accompanying the clock switching is arranged to be eliminated. Such a PLL control apparatus is disclosed in, for example, Japanese Patent Application Laid Open No. 63-228821 (1988) or Japanese Patent Application Laid Open No. 4-57536 (1992). By employing a PLL control apparatus of that kind it is possible to absorb a line hit by the PLL control apparatus even if it is generated due to switching of the dual clock generating part. Therefore, no hit will be generated in the internal clock supplied to the signal processing part.

In the conventional PLL control apparatus, the frequency for comparison of the PLL is set as low as possible in order to prevent the clock hit or the phase jump. Alternatively, the time constant of the PLL is set at a very large value. With such a measure, the control voltage of a voltage controlled oscillator is made to change gradually and smoothly. Since the PLL control apparatus achieves the resynchronization with a gradual change in the frequency and the phase of the output clock, it is possible to switch the clock without affecting the main signal. Besides, there is known a constitution in which a voltage controlled oscillator with excellent frequency accuracy and very narrow control range is used for the PLL control apparatus.

Now, in the conventional PLL control apparatus, the frequency for the phase comparison has to be set low in order to make the time constant of the PLL very large. However, accompanying the recent increase in the transmission capacity and especially in a large capacity transmission device, a high frequency is required for the internal clock of the device. On the other hand, the specifications for the tolerable phase deviation at clock switching are also very severe. Because of that, it is necessary to utilize a voltage controlled oscillator of high frequency. Furthermore, it is necessary to reduce the stationary phase error-caused by the PLL to a minimum. Accordingly, there exists a problem in that the frequency for the PLL phase comparison cannot be lowered excessively. In addition, a voltage controlled oscillator with excellent frequency accuracy and very narrow control range is generally expensive, so that its use is subject to restrictions from the viewpoint of the cost.

SUMMARY OF THE INVENTION

It is the object of the PLL control apparatus according to this invention to enable a smooth clock switching free from the phase jump without requiring a special voltage controlled oscillator, at the time of line switching from the active system to the standby system in a large capacity transmission system.

The PLL control apparatus according to this invention has a selector, to which are input first signals (active system) and second signals (standby system), each including a clock signal and a frame pulse signal synchronized thereto, of frequency f and having mutually different phases. In the selector, one out of the first signals and the second signals is selected by a line switching signal input from the outside. The apparatus has a clock phase comparator which compares the phase of the clock of the input signal and the phase of a frequency divided clock from a frequency divider in the PLL, and outputs a reference clock for which the duty factor is set corresponding to the phase difference between the two phases. Moreover, the apparatus has a low-pass filter, an amplifier, a voltage controlled oscillator and a frequency divider which constitute a PLL control circuit.

In addition, the PLL control apparatus according to this invention is equipped with a frame pulse phase comparator which compares the phases of the frame pulses of the first input signals and the second input signals, and outputs the phase difference. On the other hand, the apparatus is equipped with a duty factor controller which outputs a pseudo clock obtained by changing the duty factor of the frequency divided clock from the frequency divider to a value set in advance without changing its frequency. Furthermore, the apparatus is equipped with a clock selector which selects either one of the output of the clock phase comparator and the output of the duty factor controller, in response to the phase difference of the frame pulses. The clock selector is arranged between the clock phase comparator and the low-pass filter.

In carrying out the clock phase matching accompanying a line switching, if the reference clock is set by comparing the phase of the clock after switching and the phase of the frequency divided clock as they are, a sudden phase matching takes place when the phase difference of the frame pulses is large. This causes the phase jump. Therefore, in this PLL control apparatus the phase matching is done by using the pseudo clock when the phase difference between the frame pulses before and after the switching is large. Using the pseudo clock, it is possible to avoid the setting of the control voltage in which the duty factor is shifted from 50% in advance and a sudden phase matching takes place. As a result, a smooth phase matching, without generation of a phase jump, becomes possible.

Ordinarily, pseudo clocks with duty factors larger than and smaller than 50% are prepared in order to be able to handle both cases in which the phase of the frame pulse before a line switching lags behind and leads the phase of the frame pulse after the line switching. When the phase of the frame pulse before the line switching lags behind the phase of the frame pulse after the line switching, it is necessary to carry out the phase matching so as to advance the phase state of the frame pulse before the line switching, so that a pseudo clock having a duty factor larger than 50% is selected. In the opposite case, a pseudo clock having a duty factor smaller than 50% is selected.

In response to the phase difference detected by the frame pulse comparator, decision is made as to which of the reference clock and the pseudo clock is to be selected. When the phase difference between the two frame pulses is large, a pseudo clock is selected. In contrast, when the phase difference between the two frame pulses is already small to begin with, or when the phase difference became sufficiently small as a result of the phase matching, it is switched to the selection of the reference clock.

In the PLL control apparatus according to this invention, when the phase difference between the two frame pulses is in the lead by more than one cycle portion of the frequency f of the clock, the clock selector selects the frequency divided clock. On the other hand, when the phase state of the reference frame pulse is delayed by more than one cycle portion of the frequency f, the pseudo clock is selected. When the phase difference between the two frame pulses falls within one cycle portion of the frequency f of the clock, the reference clock is selected.

With the arrangement as in the above, the voltage of the voltage controlled oscillator is set in response to the set duty factor. In other words, the voltage is not set at a maximum value, so that the voltage for the phase matching of the clock can be set arbitrarily. Accordingly, it is possible to prevent a sudden phase change of the clock, and carry out a gradual phase matching.

The duty factor of the clock by the duty factor controller is determined by the time allowed for the phase matching. If one can afford to spend a sufficiently long time for the phase matching, one can set the duty factor in the vicinity of 50%. On the contrary, if it is required to carry out the phase matching in a short time, then, the duty factor will have to be set at a relatively large value.

Now, it is necessary to be able to deal with both cases in which the phase of the frame pulse of the input signal to the standby system leads and lags behind the phase of the active system. Consequently, in the duty factor controller, both cases of the duty factor of the clock being larger than and smaller than 50% are set, and at least two pseudo clocks are output. When the phase of the frame pulse of the standby system leads the phase of the frame pulse of the active system, it is also necessary to advance the phase of the clock. During the phase matching, a pseudo clock whose duty factor is larger than 50% is selected. On the contrary, when it lags behind, a pseudo clock having a duty factor smaller than 50% is selected.

In order to generate a pseudo clock with duty factor larger than 50% as well as a pseudo clock with duty factor smaller than 50%, the apparatus according to this invention is equipped with two duty factor controllers. Alternatively, one duty factor controller which generates a pseudo clock having one duty factor, for example, a duty factor larger than 50%, may be equipped, and may divide its output into two parts:and invert one of them by an inverter.

Moreover, if one wishes to limit the time necessary for line switching within a specified time range, one may install a clock selector having a time gate which acts linked to a line switching signal. After an elapse of a specified length of time by measuring time from the starting time of line switching following the input of a line switching signal, phase matching is made to be completed by forcibly switching the selection of the clock selector to the clock from the frequency divider. This kind of arrangement will not cause a big phase jump as was the case in the prior art because the phase matching has already been performed. Moreover, it is possible to switch the line completely without fail within a specified time interval. Ordinarily, the set time interval is smaller than one cycle period of the frequency $f_0$.

The duty factors set for the duty factor controllers need not be limited to only two levels of larger than and smaller than 50%, but may further be set more finely pitched. For example, the four levels of 20, 35, 65 and 80% of the duty factor may be chosen by providing four duty factor controllers. In that case, it may be so arranged as to provide duty factor controllers which respectively generate clocks of duty factors 65 and 80%, divide their outputs into two parts, and connect inverters to respective one branches of them.

Moreover, a constitution may be adopted in which a time gate is connected to the clock selector. In that case, a smooth phase matching becomes possible by forcibly switching the line in succession so as to bring the duty factor approach 50% after elapse of predetermined lengths of time.

Furthermore, it is possible to detect the control voltage output from the amplifier, and recognize at times the progress status of the phase matching by means of the detected voltage. It is also possible to select a pseudo clock by determining the duty factor to be selected in response to the progress status of the phase matching. Similarly, the set value of the duty factor may be changed in the duty factor controller instead of selecting a pseudo clock.

In the PLL control apparatus according to this invention, at the time of switching the input signals, the phases of the frame pulses of the signals before and after the switching are compared, and in response to the phase difference the clock selector determines which of the demultiplied clock before the switching and the clock pulse after the switching be selected. By selecting the demultiplied clock when the phase difference is larger than a specified value and the clock after the switching when it is smaller, it is possible to carry out a gentle and smooth phase matching which is free from phase jump.

Further, it is also possible to provide the apparatus with a time gate which inhibits the selection of the demultiplied clock input to the clock selector after the lapse of a predetermined specified length of time from the start of switching of the input signals. By means of the time gate, At is possible to ensure the clock matching within a specified time after the switching by arranging that the clock after the switching is selected unconditionally.

BRIEF DESCRIPTION OF THE DRAWINGS

The above and other objects, features and advantages of the present invention wall become more apparent from the following detailed description when taken in conjunction with the accompanying drawings, wherein.

DETAILED DESCRIPTION OF THE PREFERRED EMBODIMENTS

Before describing the configuration of the PLL control apparatus according to this invention, a brief description about the configuration of the prior art PLL control circuit is in order to facilitate the understanding of this invention.

Figure 1:
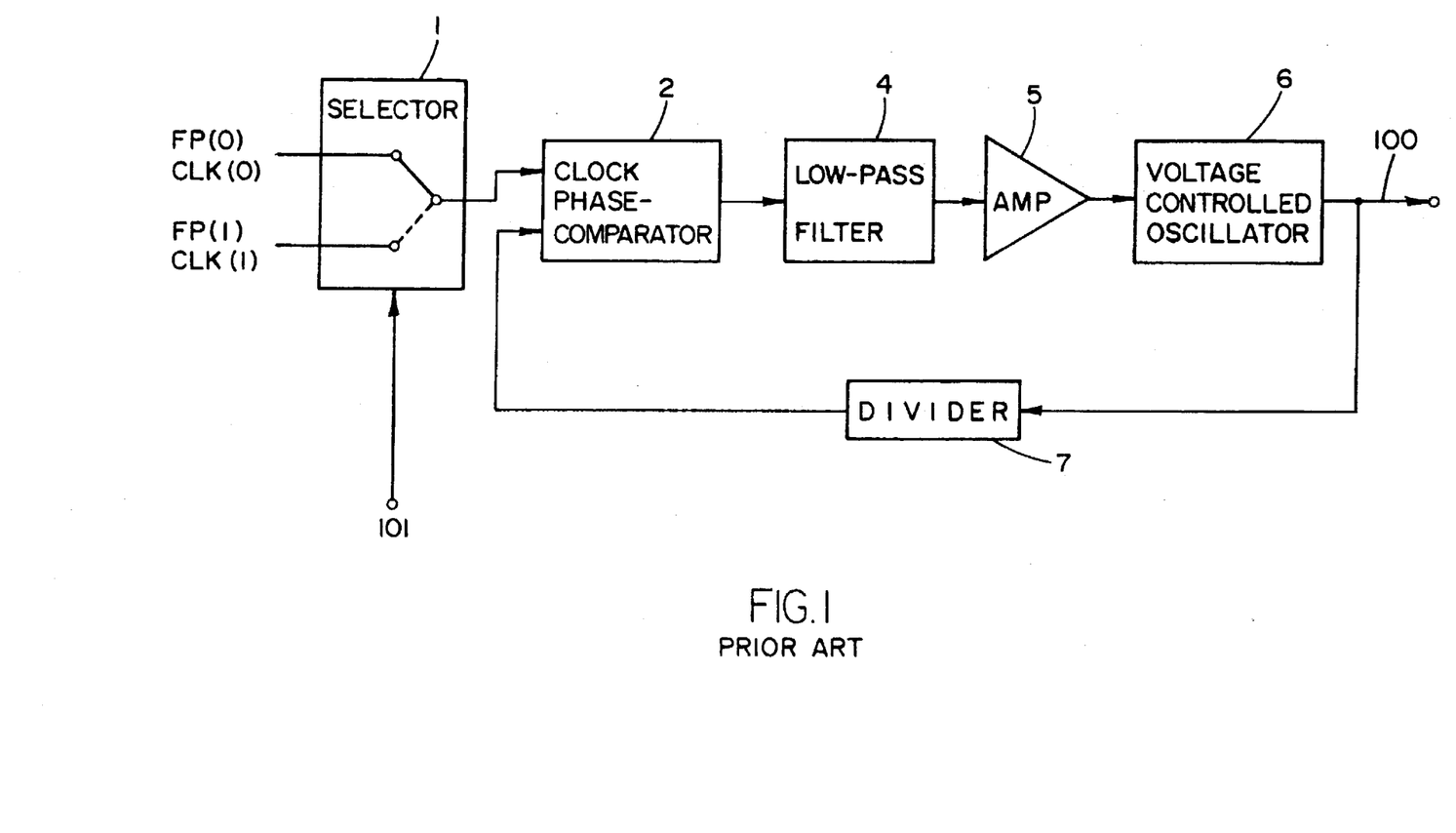
FIG. 1 is a block diagram of a PLL control apparatus having the conventional line switching function.

As shown in FIG. 1, the prior art PLL control apparatus is equipped with a clock phase comparator 2, a low-pass filter 4, an amplifier 5, a voltage controlled oscillator 6 and a frequency divider 7, for carrying out phase matching of the clock. Mere, the description of the basic operation of the phase matching for the input clock will be omitted. In a PLL control apparatus having two lines of an active system and a standby system, a selector 1 for switching between the lines for the active system and the standby system is provided on the input side of the clock phase comparator 2, in addition to the above configuration.

A frame pulse FP(0) signal of the input signal for the active system and a clock CLK(0) signal contained additionally in the input signal are input to the selector 1. Similarly, a frame pulse FP(1) signal and a clock CLK(1) signal of the input signal for the standby system are also input to the selector 1. A line switching signal 101 from the outside is input to the selector 1. When the line switching signal 101 is input, the line of the selector 1 is switched, for example, from the line for the active system to that for the standby system and at the same time, the phase of the frame pulse of the active system is subjected by the PLL control circuit in the poststage to phase matching with the phase of the frame pulse of the standby system.

Normally, the phase of the frame pulse of the active system does not match the phase of the frame pulse of the standby system. In the prior art PLL control apparatus, when the line is switched, the control voltage of the voltage controlled oscillator 6 is set so as to bring the phase matching between the frame pulses irrespective of the phase difference between them. Since the control voltage is set at a maximum value at that time, there is generated a sudden phase change, causing the so-called phase jump.

Next, referring to the drawings, this invention will be described.

Figure 2:
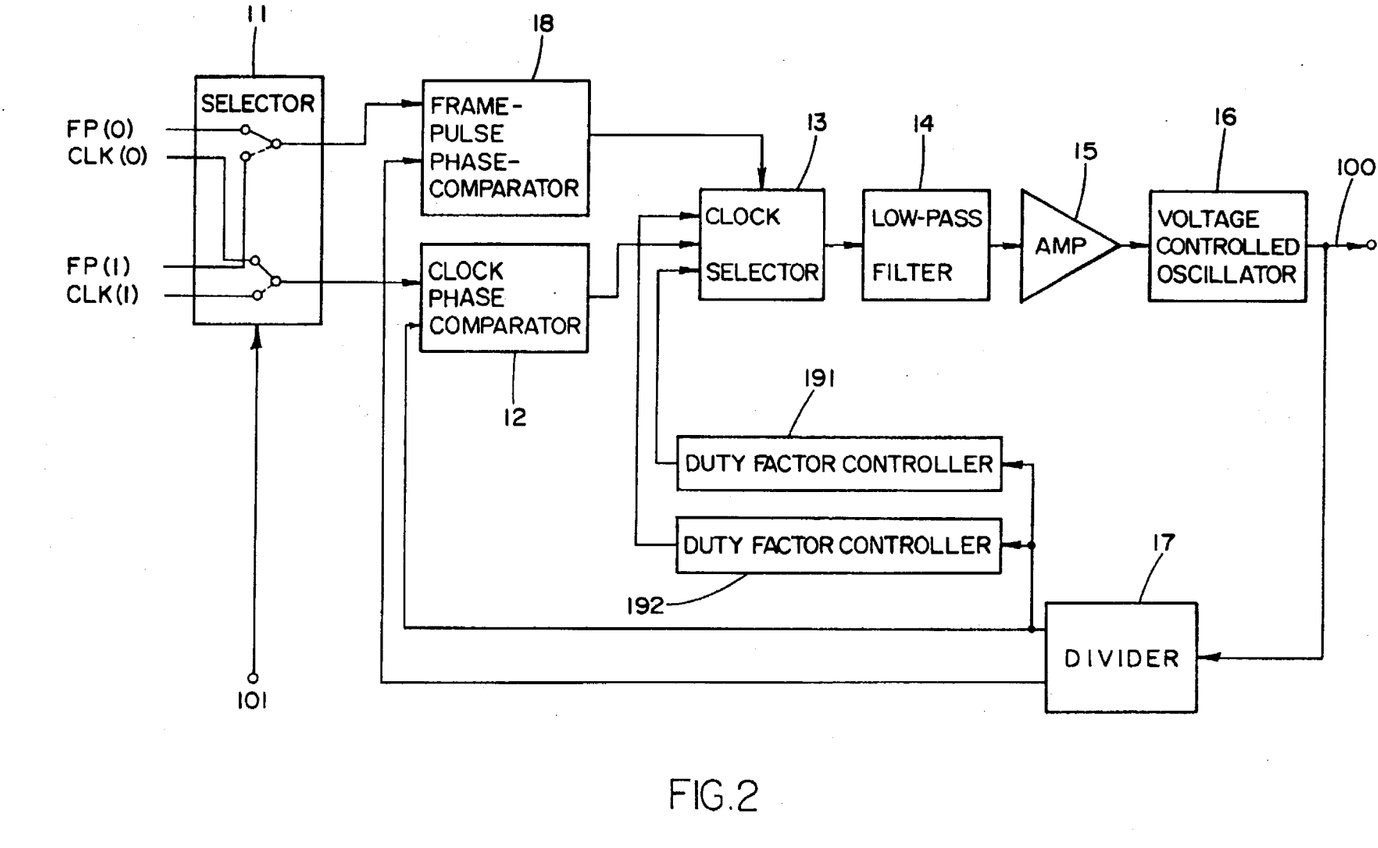
FIG. 2 is a block diagram showing the configuration of a first embodiment of the PLL control apparatus of the invention.

FIG. 2 is a block diagram showing the configuration of a first embodiment of the PLL control apparatus according to this invention. The PLL control apparatus of this invention is equipped with a selector 1 which receives signals (CLK(0) and FP(0)) of the active system having a clock (CLK) signal and a frame pulse (FP) signal synchronized thereto, and signals (CLK(1) and FP(1)) of the standby system with phases different from those of the active system. These inputs to the selector 1 may be input through the same terminal for the frame pulse and the clock as is the case for the conventional configuration. Here, it is assumed that they are input through separate terminals to simplify the description.

In the post stage of the selector 1 there are provided a low-pass filter 14, an amplifier 15, a voltage controlled oscillator 16 and a frequency divider 17 which constitute the basis of the PLL control circuit. In addition to the above, the PLL control apparatus of this invention is equipped On the output side of the frequency divider 17 with a clock selector 13 and duty factor controllers 191 and 192 which control the duty factors of frequency divided clocks.

In the selector 1, line switching is performed by the line switching signal 101 input from the outside, to carry out the selection of the input signals. When the input signals are selected, the frame pulse FP and the clock CLK of the signals are input to a frame pulse phase comparator 18 and a clock phase-comparator 12, respectively. In the clock phase-comparator 12, the phase of the frequency divided clock output from the frequency divider 17 and the phase of the input clock signal output from the selector 1 are compared, and a reference clock with a duty factor corresponding to the phase difference is output. When the demultiplied clock is generated in the frequency divider 17, it is output with the frequency same as that of the signal input to the clock phase comparator 12. This reason is that the clock frequencies of both the active system and the standby system are given the same value specified in advance.

From the frequency divider 17, a frame pulse synchronized with the frequency divided clock and has the same frequency as that of the frame pulse of the input signal is output to the frame pulse phase comparator 18. The frame pulse phase comparator 18 compares the phases to the frequency divided frame pulse output from the frequency divider 17 and the frame pulse FP output from the selector 1 are compared, and the phase difference is output.

A frequency divided clock of the clock generated by the voltage controlled oscillator 16 and a frequency divided frame pulse with the same frequency as that of the original frame pulse are output from the frequency divider 17. Since the duty factor of the clock is set at 50%, the duty factor of the frequency divided clock also has a duty factor of 50%. Two duty factor controllers 191 and 192 are installed on the side where the frequency divided clock of the frequency divider 17 is output. These respective duty factor controllers 191 and 192 have the function of changing the duty factor o f the frequency divided clock from 50%. For example, in this embodiment, the duty factors are set at 75% and 25%, and these clocks are output as pseudo clocks. The clock selector 13 is connected to the duty factor controllers 191 and 192, and the clock phase comparator 12. These two pseudo clocks and the clock input from the phase comparator 12 are selected in response to the phase difference between the two frame pulses detected in the frame pulse phase comparator 18.

In order to be able to handle both cases in which the phase of the frame pulse before the line switching leads and lags behind the phase of the frame pulse after the line switching, there are prepared pseudo clocks having duty factors larger than 50% and pseudo clocks having duty factors smaller than 50%.

When the phase of the frame pulse before the line switching lags behind the phase of the frame pulse after the line switching, it is necessary to perform phase matching so as to advance the phase state of the frame pulse before the line switching, so that a pseudo clock having a duty factor larger than 50% is selected. In the opposite case, a pseudo clock having a duty factor smaller than 50% is selected.

In this embodiment, a pseudo clock is selected if the phase difference between the frame pulses is larger than one cycle portion of the clock. If the phase difference between the frame pulses is smaller than one cycle portion of the clock, the reference clock is selected by assuming that the phase jump will not take place. When the reference clock is selected, phase matching is done in the same manner as in the ordinary case.

The duty factor of the pseudo clock is determined based on the clock selection standard of the clock selector 1 set by the phase difference between the frame pulses before and after the line switching, and the time allowed for the phase matching. Namely, when the standard of the phase difference by which a pseudo clock is selected is large, the duty factor of the pseudo clock has also to be set at a relatively large value. The reason for this is that if the duty factor of the pseudo clock is set in the neighborhood of 50% in spite of a large value of the standard of the phase difference, it becomes difficult in the long run to effectively avoid the phase jump.

On the other hand, when the time allowed for the phase matching is short, it is not possible to substantially shift the duty factor of the pseudo clock from 50%. This is because when the time allowed for the phase matching is short, it is necessary to quickly perform the phase matching by keeping the duty factor in the vicinity of 50% to raise the control voltage.

Here, what needs be kept in mind as to the setting of the duty factor of the pseudo clock is the fact that the phases of the frame pulses have to be kept always equal during the phase matching that uses the pseudo clock in the state where the pseudo clock is selected. If a situation arises in the state where the pseudo clock is selected that the duty factor of the pseudo clock is set too high such that the control voltage acts in the wrong manner, then the phases of the frame pulses will move in the mutually separating directions. Therefore, in the state where the pseudo clock is selected, the control voltage for the pseudo clock has to be set so as to always bring about the matching of the phases of the frame pulses.

The above problem will be resolved in a clear-cut manner by the provision of a plurality of pseudo clocks as will be described later in conjunction with a third embodiment of the invention.

Next, the basic operation of the PLL control apparatus of this invention having the above configuration will be described. First, assume that the line switching signal 101 is input to the selector 1, and the lines are switched from those of the active system to those of the standby system. The phase of the frame pulse of the standby system input to the frame-pulse phase-comparator 18 is compared with the phase of the frame pulse of the active system, and the phase difference is output to the clock selector 13.

Normally, the frame pulses before and after the line switching necessarily generate a phase difference. In the PLL control apparatus according to this invention, as long as the phase difference is larger than a specified value, no phase matching will be carried out by using the reference clock, as it is, which is set based on the phase difference between the frequency divided clock of the PLL control circuit and the input signal. As long as the phase difference is larger than the specified value, the phase matching is carried out by using a pseudo clock where the duty factor of the frequency divided clock is set larger than or smaller than 50%. When the phase difference is positive, namely, when the phase of the frame pulse of the standby system is in the lead, a pseudo clock having a duty factor larger than 50% is selected in order to advance the phase of the active system. On the contrary, when the phase difference is negative, a pseudo clock having a duty factor smaller than 50% is selected.

As An the above, until the completion of the phase matching a pseudo clock with duty factor different from 50% is used. By carrying out the phase matching using a clock with duty factor deviating from 50%, a control voltage for the phase matching to be supplied to the voltage controlled oscillator can be set in analog mode, and a sudden phase change can be avoided, so that it is possible to carry out a smooth phase matching. Upon completion of the phase matching the input to the clock selector 13 is switched to the output side of the phase comparator 12.

In the PLL control apparatus shown in FIG. 2, two duty factor controllers 191 and 192 for setting duty factors larger than and smaller than 50%, respectively, are provided on the output side of the frequency divider 17.

Figure 3:
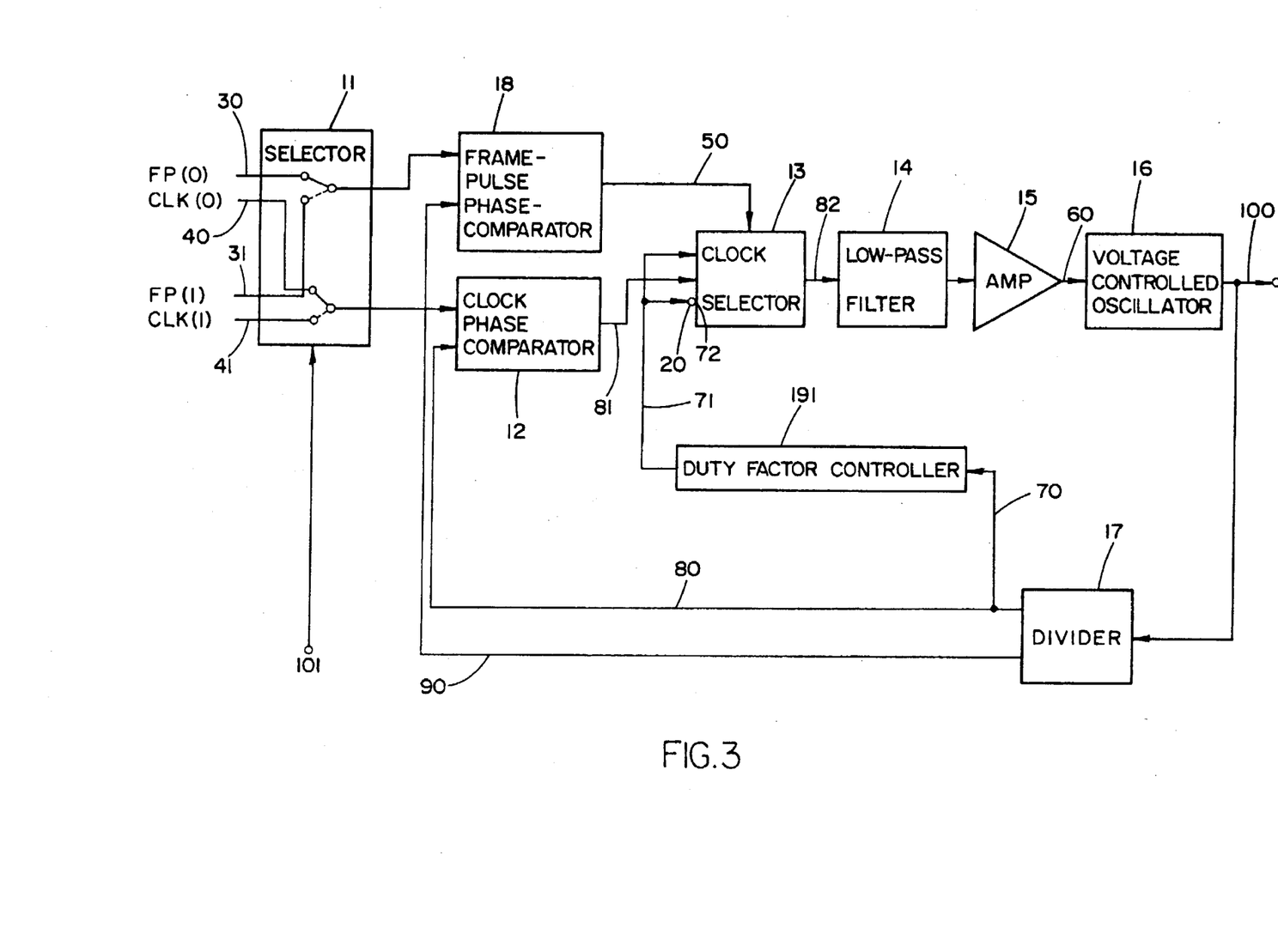
FIG. 3 is a block diagram showing another configuration of the first embodiment of the PLL control apparatus of the invention.

In contrast, the PLL control apparatus in FIG. 3 has only one duty factor controller 191. The pseudo clock modified by the duty factor controller 191 is branched into two parts before it is input to the clock selector 13, and one of them is connected to an inverter 20 to have its phase inverted. With this arrangement it becomes possible to select either one of the two pseudo clocks having duty factors larger than and smaller than 50%. Since the functions of the low-pass filter 14, the amplifier 15 and the voltage controlled oscillator 16 are the same as in the conventional PLL control apparatus, description them will be omitted here.

Figure 4:
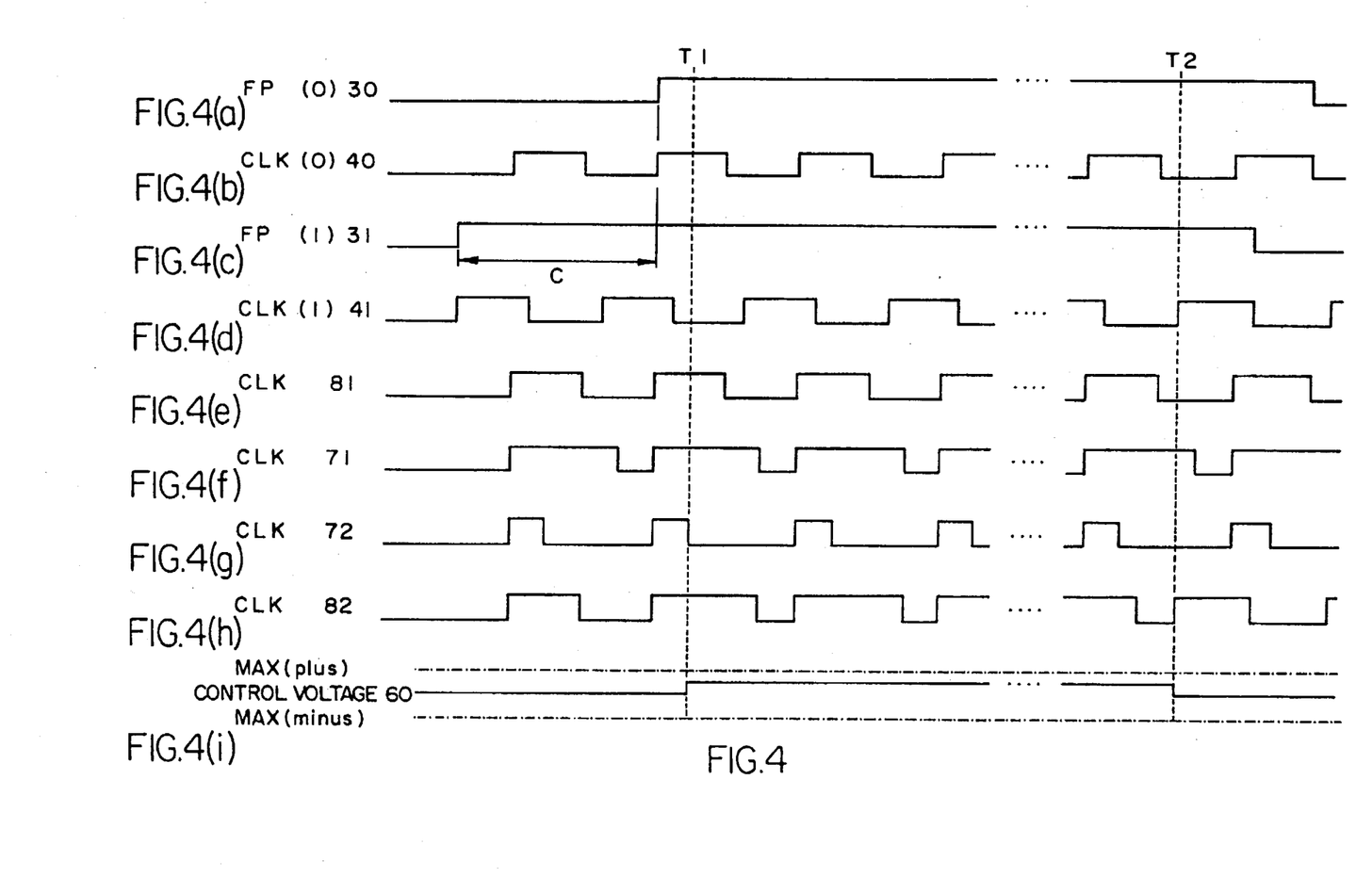
FIG. 4 is a time chart showing the clock and the like in the first embodiment of the PLL control apparatus of the invention.

Referring to FIG. 3 and a time chart shown in FIG. 4, the phase matching accompanying the line switching that employs the PLL control apparatus of this invention will be described. The reference symbols FP(0) 30 and FP(1) 31 represent the frame pulses of the signals of the active system and the standby system. respectively (FIGS. 4(a) and 4(c)). The reference symbols CLK(0) 40 and CLK(1) 41 represent the clock signals of the active system and the standby system, respectively (FIGS. 4(b) and 4(d)). Note that in FIG. 4 the frame pulse is shown only for its one cycle portion. In order to enhance the accuracy of the phase matching of the frame pulses, the frequency of the clock is ordinarily set at a sufficiently higher value than the frequency of the frame pulse. For example, if the frequency of the frame pulse is 8 kHz, the frequency of the clock is set at 80 kHz.

Now, assume that a line switching signal 101 is input to the selector 1 at the time $T_1$. Further assume at that time that the phase of the frame pulse of the input signal for the standby system is ahead of that for the active system by an amount of C (FIG. 4(c)). This phase difference C is detected after the line switching by the frame pulse phase comparator 18, and is output to the clock selector 13.

On the other hand, in the stationary state, the frequency divider 17 outputs a frame pulse 90 and a frequency divided clock 80 having the same-phase-as that of the clock of the active system to the frame pulse phase comparator 18 and the clock phase-comparator 12, respectively. It is arranged such that after the line switching the input to the clock phase-comparator 12 is switched to select the frequency divided clock The frequency divided clock 80 is branched into two parts, and the branched frequency divided clock 70 is input to the duty factor controller 191. Although the duty factor of the frequency divided clock 70 is 50%, a pseudo clock 71 output by the duty factor controller 191 has a modified duty factor of 75%. The pseudo clock 71 is further split into two parts, and they are input to the clock selector 13 with one part as it is and the other part via an inverter. 20 (FIGS. 4(f) and 4(b)). Accordingly, three signals, having one demultiplied clock 81 with duty factor 50% (FIG. 4(e)) and two pseudo clocks with duty factors 75 and 25%, are input to the clock selector 13.

Here, it can be seen that the phase difference between the frame pulses is larger than one cycle portion of the clock. Therefore, under this condition the clock selector 13 selects a pseudo clock. In addition, the phase difference is positive, that is, the frame pulse FP(1) 31 of the standby system is in the state of being ahead, so that the frame pulse of the active system has to be advanced. Accordingly, a pseudo clock 71 with duty factor larger than 50% is selected. In the state where the pseudo clock 71 is selected, a phase-locked loop is formed, and the phase matching is carried out. During this period, control voltage 60 is in the positive state (FIG. 4(i)). Note, however, that the control voltage does not go to a maximum value and takes on an intermediate value since the duty factor is not 100%. Further, the frequency divider 17 outputs the frame pulse 90 which is being phase matched to the frame-pulse phase-comparator 18.

When the phase difference between the frame pulses becomes smaller than one cycle portion of the clock as a result of the phase matching employing the selected pseudo clock, the clock selector 13 selects the reference clock output from the clock phase-comparator 12. It is because there is no possibility of generating a phase jump in this state. The phase matching is carried out in this state so as to bring the phase difference to zero (drawing omitted).

When the phase difference between the frame pulse 30 of the active system before the switching and the frame pulse 90 output from the frequency divider 17 goes to zero ($T_2$ in FIG. 4), it is regarded that the phases of the two frame pulses are matched. At that time, selection of the input to the clock selector 13 is switched from the pseudo clock 71 to a frequency divided clock 81, completing the phase matching.

In this embodiment, when the phase of the frame pulse FP(1) of the standby system is ahead of the phase of the frequency divided frame pulse 90 by more than one cycle portion of the clock, the clock selector 13 selects the pseudo clock 71 which is the output clock from the frequency divider 17. On the contrary, when it is delayed by more than one cycle portion of the clock, the clock selector 13 selects a pseudo clock 72 which is the output of the frequency divider 17 with its phase inverted by the inverter 20. The frequency divider clock is input to the voltage controlled oscillator 16 as its control voltage in the form of a pulse having a duty factor which is 1/N of the case where an "H" level is applied to the low-pass filter 14. In this embodiment, the selection standard for the pseudo clock is set to be one cycle portion of the clock, but it is not limited to that value and can be set arbitrarily.

As described in the above, at the time of switching the input selector 1, a clock is selected in response to the phase difference between the frequency divided frame pulse before the switching and the frame pulse after the switching. In that case, the frequency divided clock is selected if the phase difference is larger than one cycle portion of the clock, and the clock of the signal after the switching is selected if it is smaller. With this constitution, it becomes possible to accomplish the phase matching by letting the phase difference accompanying the switching converge to zero smoothly without generating a phase jump which tended to occur in the conventional PLL control apparatus. In this embodiment, one cycle portion of the clock has been taken as the discrimination standard for the phase difference, but the standard setting can be changed with out being limited to that value.

Next, a second embodiment which is obtained by adding a time gate to the configuration of the first embodiment will be described. In the second embodiment, the phase matching is arranged to be completed within a specified period of time by ending the phase matching after the passage of a desired length of time by means of the time gate.

Figure 5:
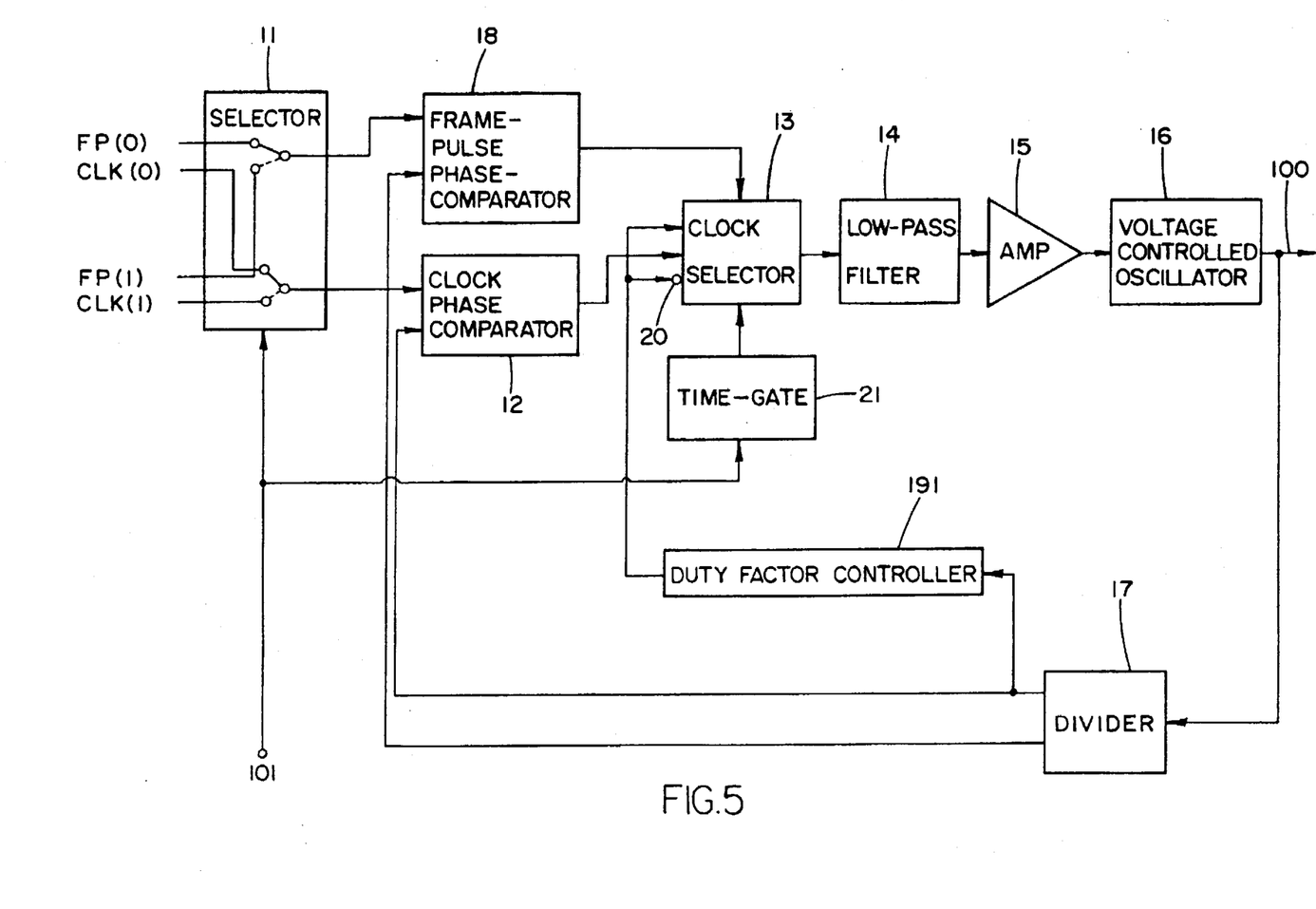
FIG. 5 is a block diagram showing the configuration of a second embodiment of the PLL control apparatus of the invention.

FIG. 5 is a block diagram showing the configuration of the second embodiment. In comparison to the first embodiment shown in FIG. 3, this embodiment differs in that a time gate 21 which measures the time linked with the line switching signal 101 is added to the selector 13. The time gate 21 receives the line switching signal 101 which is input to the selector 1. With this moment as the starting time, phase matching is performed according to a procedure similar to the above until the passage of a time set in advance. After the passage of the specified period of time, a selection switching signal is sent to the clock selector 13 to cause it to select the clock of the signal after the switching irrespective of the phase difference.

Accordingly, by the provision of the time gate it becomes possible to compel the clock selector 13 to select the clock of the signal after the switching. In other words, the apparatus is made to operate a smooth phase matching until a specified period of time passes. Thus, the phase matching within a specified length of time can be ensured by introducing a forcible switching at a point of time when the phase difference became small after the passage of certain period of time.

The setting time of the time gate 21 used in the second embodiment will be described An detail.

Figure 6:
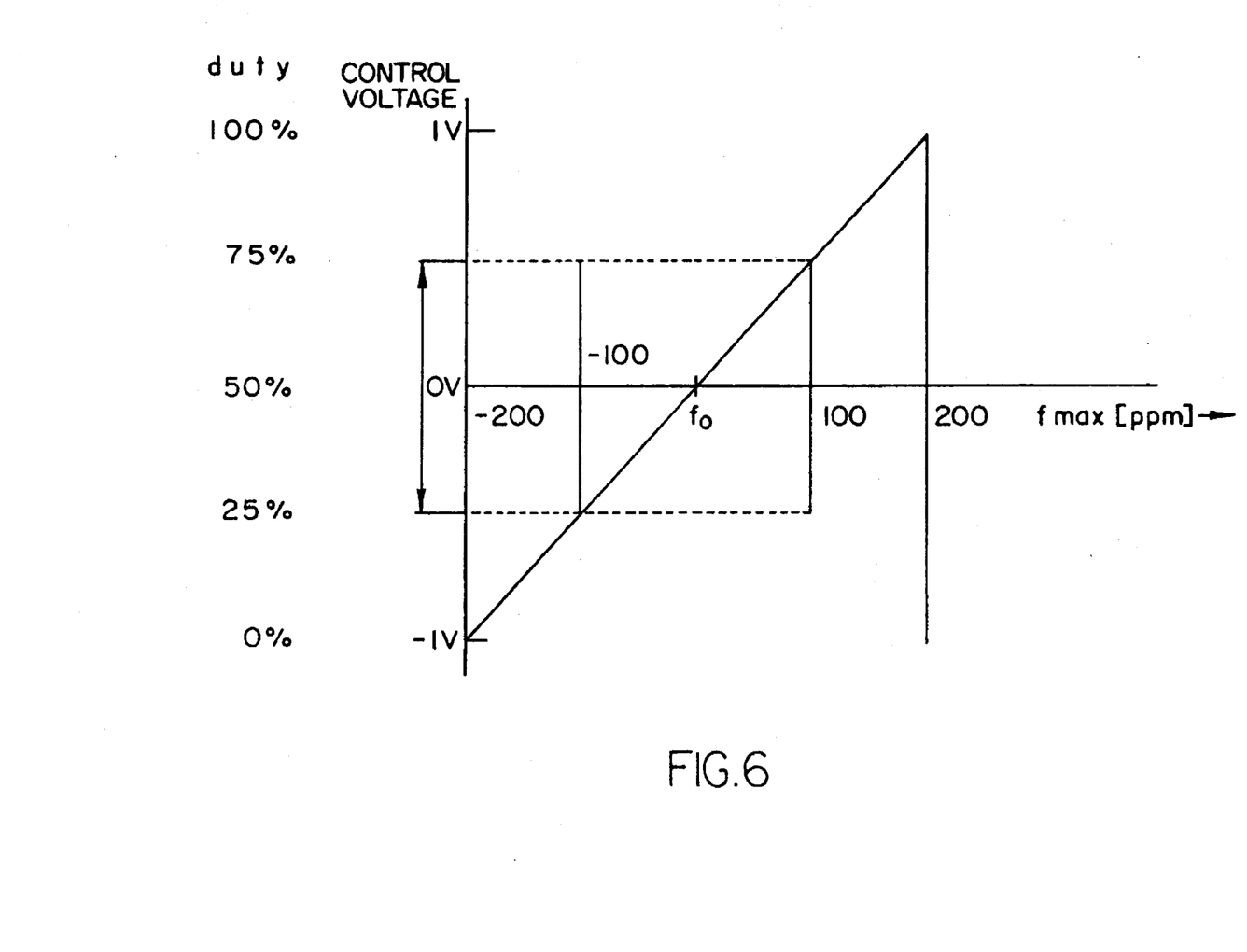
FIG. 6 is a graph showing the relation between the signal frequency and the control voltage in the clock switching of the PLL control apparatus of the invention.

Before specific description of the time setting method, the relation between the clock frequency and the voltage of the frame pulse, shown in FIG. 6, of a transmission device employing the PLL control apparatus of this embodiment will be described. In this embodiment, it is assumed that the frame pulse frequency $f_0$ is 2 kHz and the frame phase absorption is 10 µs. In that case, the time gate setting time $\tau$ is given by $$\tau = \frac{1}{2 \times 10^3 \times 100 \times 10^{-6}} \times \frac{10 \times 10^{-6}}{500 \times 10^{-6}}$$
$$= 100 \times 10^{-3}$$
$$= 100 \text{ [ms]}.$$

From the result of the computation, it can be seen that the time gate setting time $\tau$ needs be set at 100 ms. In the above expression, the first factor on the right-hand side of the first line is the inverse of the product of the frequency f and the variable width of the frequency f. This represents the maximum time necessary for the phase matching. In this embodiment, a time of five seconds at the worst is needed for the time period. The variable width of the frequency f is set here at 100 ppm. This range needs be set to have a width for which a fault such as a phase jump would not be generated even when the second frequency divided clock is not selected by the time gate 21, and the clock of the signal after the switching is selected. On the other hand, the second factor is the quotient of the frame phase absorption divided by the inverse of the frame pulse frequency, namely, the frame pulse length. It represents the ratio of the frame phase absorption amount to the frame pulse length.

Therefore, if the time gate 21 in FIG. 5 is set at 100 ms, the clock selection is performed according to the state of the phase difference between the frequency divided frame pulse, up to the period of 100 ms. In that way, the phase is switched smoothly. If the phase matching took time longer than 100 ms, the second frequency divided clock is no longer selected, and the clock of the signal after the switching is selected. Because of this, elapse of a needlessly long time can be prevented, and a correct switching can be ensured.

According to the PLL control method of this invention, the switching between the active system and the standby system does not depend on the clock frequency of the phase comparison and the time constant of the PLL even if there is a phase deviation between the input frame pulses. Because of this, it is possible to suppress the control voltage for the voltage controlled oscillator at the time of the switching. It is possible to absorb the clock hit and phase jump while suppressing the frequency displacement of the PLL output clock. Accordingly, it becomes possible to carry out the clock switching within a large capacity transmission device without affecting the main signal.

Furthermore, the apparatus of this embodiment is equipped with a time gate which operates linked with the starting time of the switching, in the output part from the frequency divider to the clock selector. By constructing a PLL such that the phase difference between the clocks can be regarded to lie within one cycle of the clock after the lapse of a specified time set in advance, it is also possible to limit the time necessary for the switching within a specified period of time.

Figure 7:
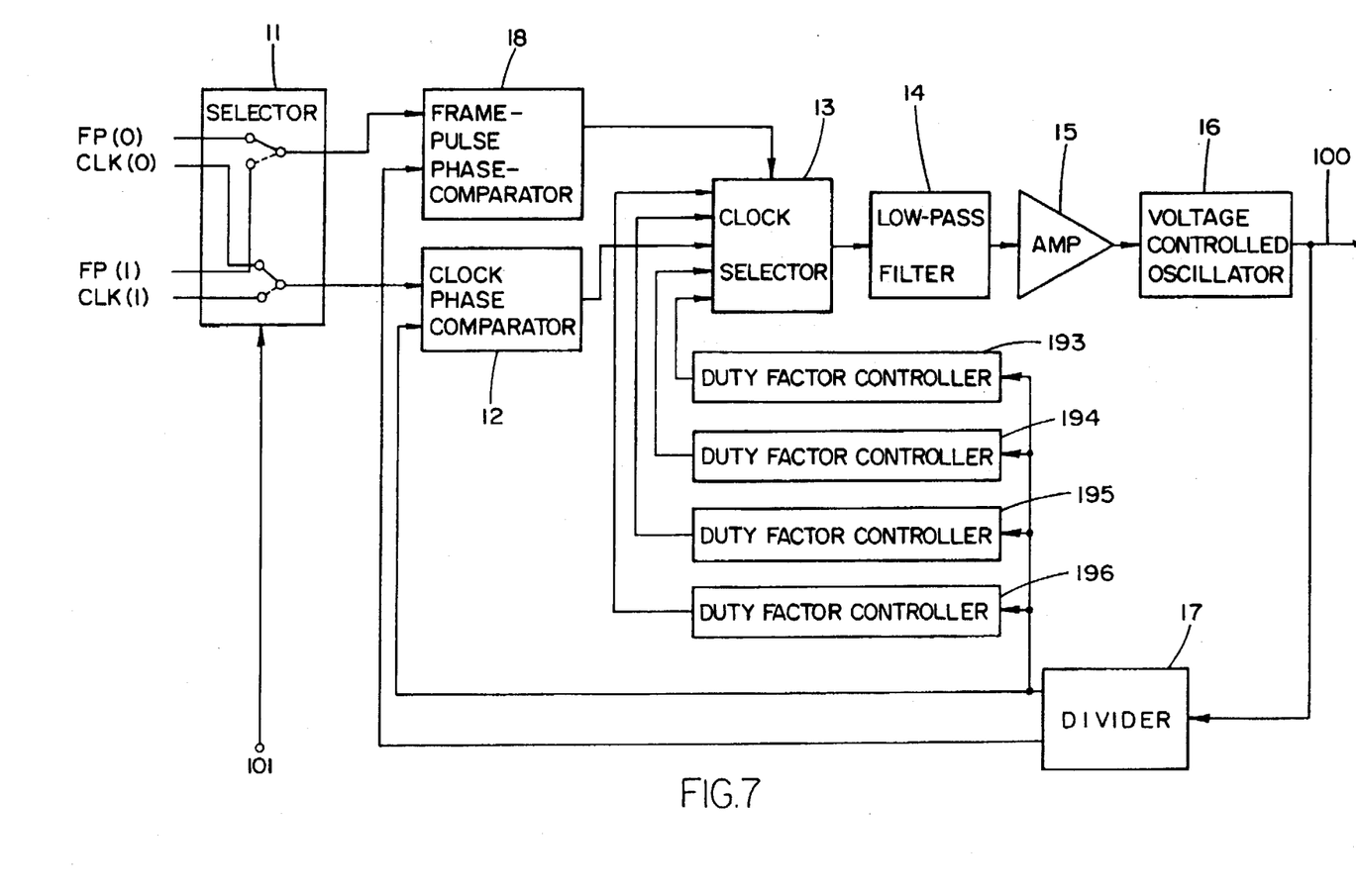
FIG. 7 is a block diagram showing the configuration of a third embodiment of the PLL control apparatus of the invention.

A third embodiment of the PLL control apparatus of this invention will be described. As shown in FIG. 7, this embodiment is equipped with four duty factor controllers 191 to 193 on the output side of the frequency divider 17, and four, rather than two, duty factors are set for the frequency divided clock. Here, they are set, for example, at four duty factors of 65, 80, 20 and 35%.

In this embodiment, first, the frame pulses of the active system and the standby system are compared An the frame pulse phase comparator 18. Which of a pseudo clock with duty factor larger than or smaller than 50% is to be selected is determined by the phase difference between the frame pulses. In this embodiment, the apparatus is further so constructed as to select, according to the value of the phase difference, a pseudo clock better suited for the phase matching among the candidates, even when a pseudo clock with duty factor, for example, larger than 50% is to be selected. Namely, when the phase difference is large, a pseudo clock with larger duty factor is selected in order to accomplish the phase matching more quickly. On the other hand, when the phase difference is not too large, a pseudo clock with smaller duty factor is selected. Moreover, after the selection of a first pseudo clock the phase difference is monitored at times to change, according to the phase difference, the pseudo clock to be selected thereafter, to carry out the phase matching smoothly and quickly.

Figure 8:
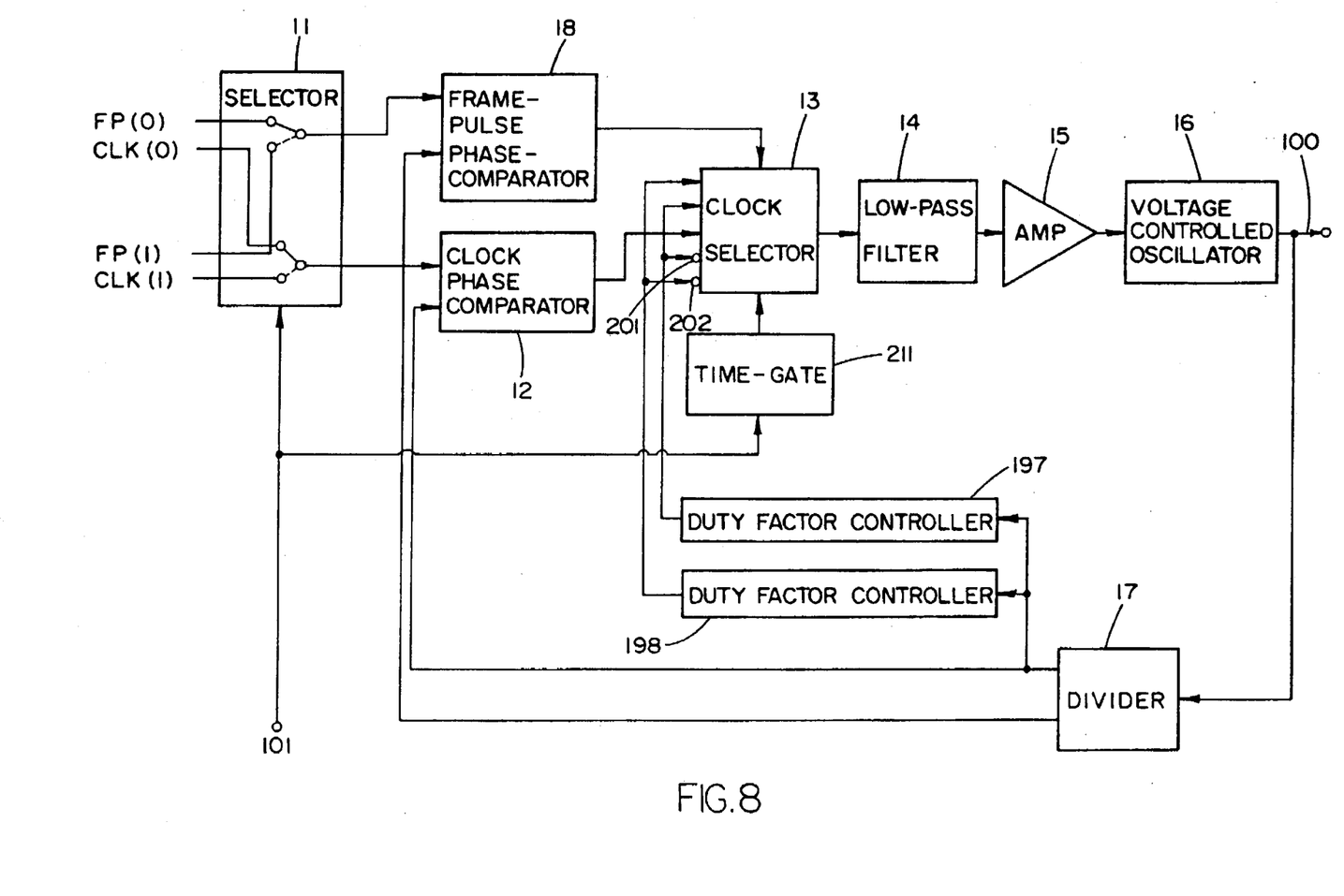
FIG. 8 is a block diagram showing another configuration of the third embodiment of the PLL control apparatus of the invention.

FIG. 8 shows the third embodiment in which the duty factor controllers are limited to only two of 197 and 198, and respective phases of the pseudo clocks are inverted, similar to another configuration of the second embodiment, by using inverters 201 and 202 to generate pseudo clocks of four levels of duty factors. In this embodiment, a time gate 211 is installed, and the pseudo clock is switched in response to the lapse of time. Needless to say, it is also possible in this embodiment to switch the pseudo clock by the phase difference.

Figure 9:
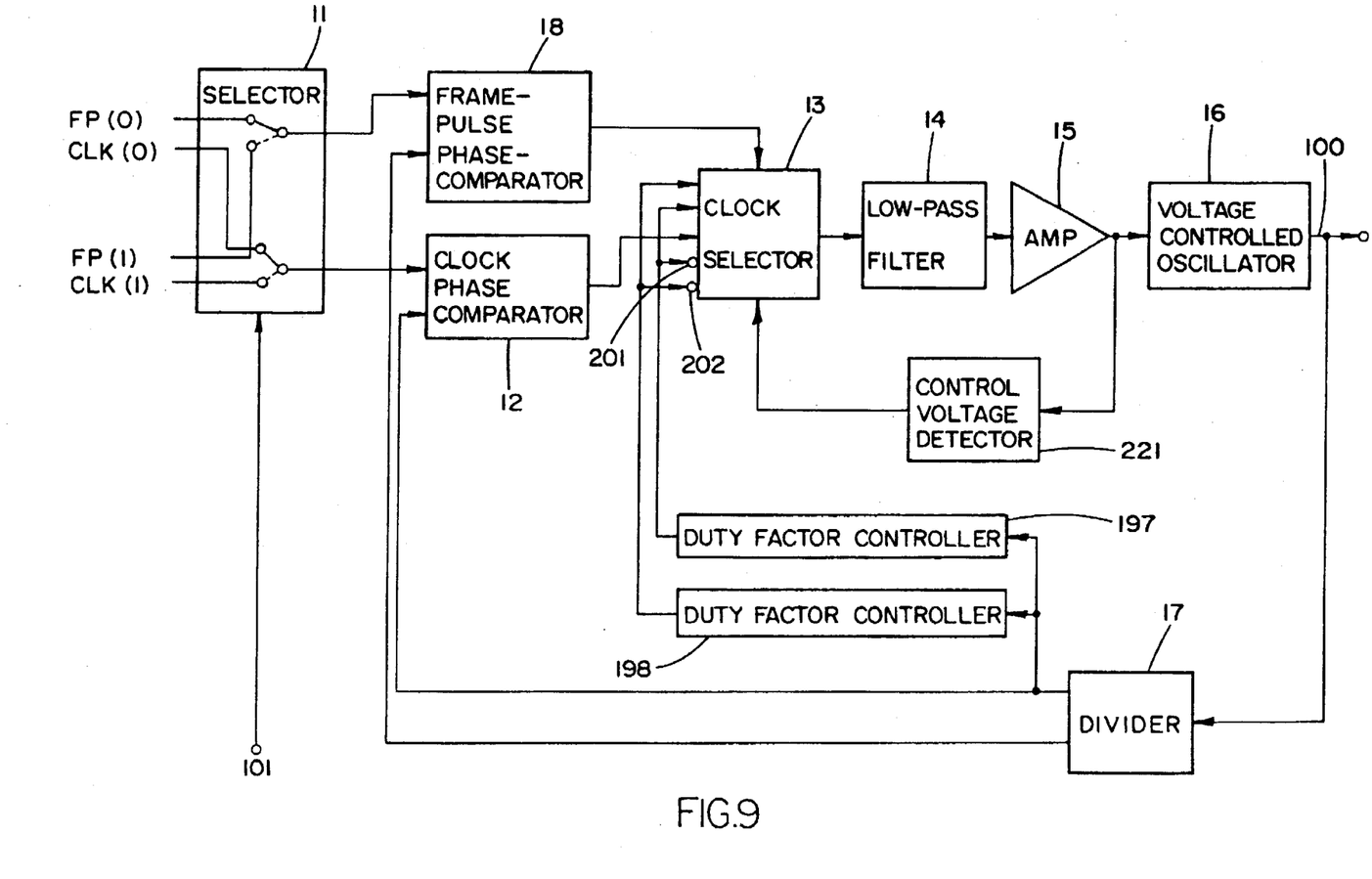
FIG. 9 is a block diagram showing the configuration of a fourth embodiment of the PLL control apparatus of the invention.

Further, a fourth embodiment of the PLL control apparatus of this invention will be described. FIG. 9 which shows the fourth embodiment is different from the third embodiment in that a control voltage detector 221 is connected to the output side of the amplifier 15. In this embodiment, the control voltage is detected by the control voltage detector 211. The phase difference is evaluated based on the value of the detected control voltage, and a selection signal is sent to the clock selector 13 so as to select an appropriate pseudo clock. In the configuration shown in FIG. 10, the phase difference is evaluated based on the detected control voltage in the control voltage detector 222, and a control signal is sent to a duty factor controller 199. Using the control signal the duty factor of the pseudo clock is regulated to be shifted gradually from a high value to a low value.

Figure 10:
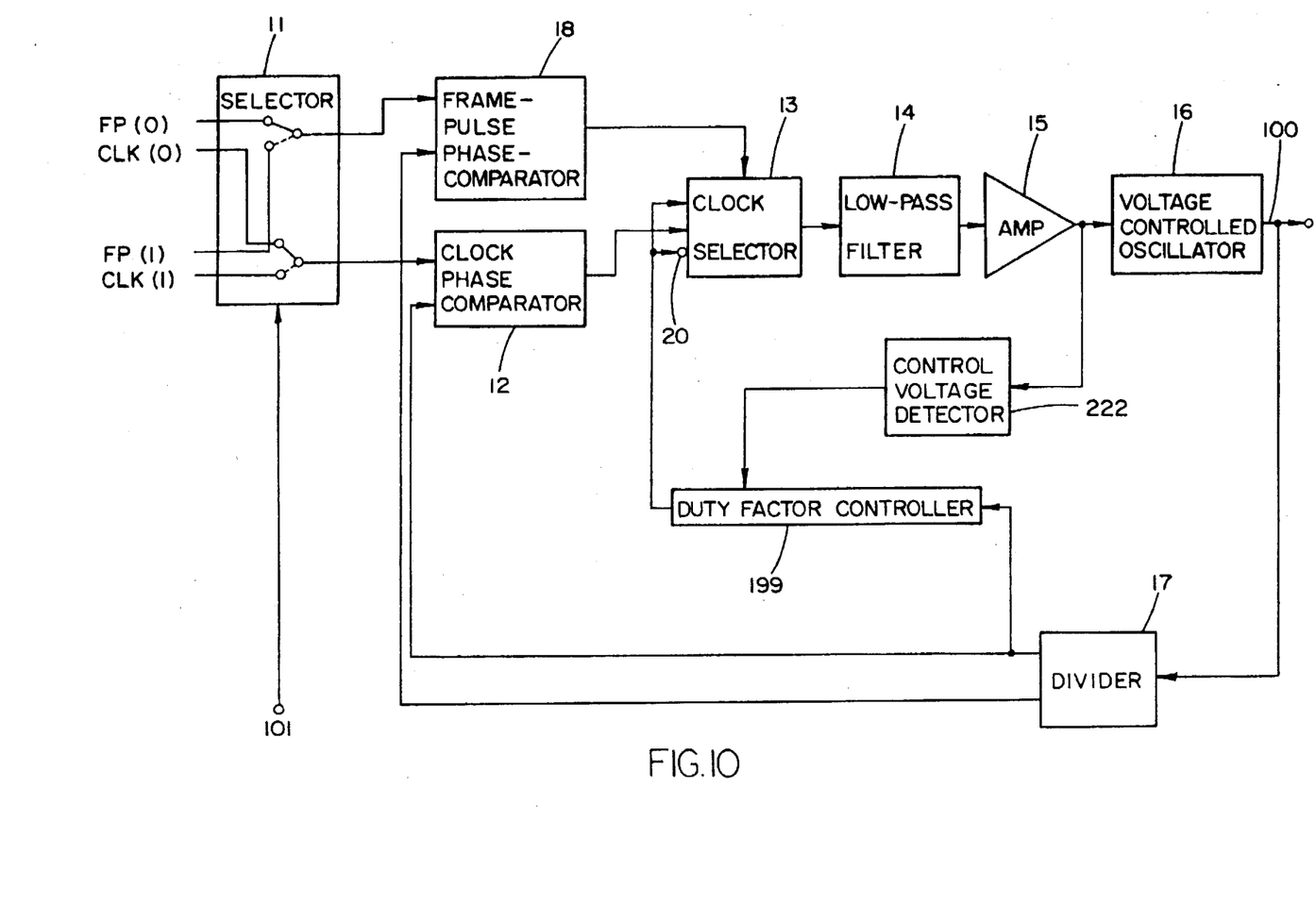
FIG. 10 is a block diagram showing another configuration of a fourth embodiment of the PLL control apparatus of the invention.

In the fourth embodiment, the phase difference is detected constantly, and the phase matching is carried out by changing the phase of the pseudo clock in response to the phase difference. Consequently, when the phase difference immediately after the switching is large, the duty factor of the pseudo clock is set at a relatively large value. Since it is possible to diminish the duty factor of the pseudo clock as the phase difference is reduced subsequently, a quicker and smoother phase matching becomes possible.

While this invention has been described in connection with certain preferred embodiments, it is to be understood that the subject matter encompassed by way of this invention is not to be limited to those specific embodiments. On the contrary, it is intended for the subject matter of the invention to include all alternatives, modifications and equivalents as can be included within the spirit and scope of the following claims.

What is claimed is:

1. A phase locked loop control apparatus comprising:

selector means for outputting input clock signal and frame pulse by switching among a plurality of input signals including a plurality of input frame pulses and a plurality of input clock signals;

a phase locked loop control circuit including a low-pass filter, an amplifier connected to an output of said low-pass filter, a voltage controlled oscillator connected to an output of said amplifier, a frequency divider which is connected to an output of said voltage controlled oscillator and outputs a frequency divided clock, and a clock phase-comparator which compares a phase of said frequency divided clock with a phase of said selected input clock signal provided from said selector means and outputs a reference clock having a duty factor that varies in response to a clock phase difference between said phase of said frequency divided clock and said phase of said selected input clock signal;

frame pulse phase comparison means for outputting a frame phase difference signal by comparing phases of said frequency divided clock and said selected frame pulse provided from said selector means;

frequency divided clock branching means for outputting branched frequency divided clocks by branching said frequency divided clock;

duty factor control means for receiving said branched frequency divided clocks and outputting pseudo clocks by setting duty factors of said branched frequency divided clock to predetermined values; and clock selection means arranged between said frame pulse phase comparison means and said low-pass filter for selecting one of said reference clock and said pseudo clocks in response to said frame phase difference signal.

2. The phase locked loop control apparatus as claimed in claim 1, wherein said clock selection means is equipped with means for selecting said pseudo clock when said frame phase difference signal is larger than a value set in advance and selecting said reference clock when said frame phase difference signal is smaller than said value set in advance.

3. The phase locked loop control apparatus as claimed in claim 2, wherein said frequency divided clock has a duty factor 50% and said pseudo clocks include at least one pseudo clock with duty factor larger than 50% and at least one pseudo clock with duty factor smaller than 50%.

4. A phase locked loop control apparatus comprising:

selection means for outputting a selected frame pulse and a selected clock by receiving first input signals and second input signals, said first input signals including a first input frame pulse and a first input clock, and said second input signals including a second input frame pulse and a second input clock, said first and second input clocks having a frequency f, said selection means switching lines of said first and second input signals in response to a line switching signal;

a low-pass filter which passes a low frequency part of a voltage of a phase control clock and outputs a low frequency voltage;

an amplifier which outputs a control voltage by amplifying said low frequency voltage;

a voltage controlled oscillator which generates an output clock in response to said control voltage;

a frequency divider which outputs a frequency divided clock and a frequency changed frame pulse by frequency dividing said output clock;

frame-pulse phase comparison means for outputting a difference signal by comparing phases of said selected frame pulse and said frequency changed frame pulse;

clock phase comparison means for outputting a reference clock having a duty factor corresponding to a phase difference of said selected clock and said frequency divided clock;

duty factor control means for outputting a pseudo clock by modifying a duty factor of said frequency divided clock; and clock selection means for outputting said phase control clock to said low-pass filter by selecting between said reference clock and said pseudo clock in response to said difference signal.

5. The phase locked loop control apparatus as claimed in claim 4, wherein said clock selection means is equipped with means for selecting said pseudo clock when said difference signal is larger than a value set in advance and selecting said reference clock when said difference signal is smaller than said value set in advance.

6. The phase locked loop control apparatus as claimed in claim 5, wherein said duty factor control means outputs at least one advanced pseudo clock having duty factor larger than 50% and at least one delayed pseudo clock having duty factor smaller than 50%.

7. The phase locked loop control apparatus as claimed in claim 6, wherein said clock selection means selects one of said advanced pseudo clock, said delayed pseudo clock, and said reference clock in response to said difference signal, said advanced pseudo clock being selected when a phase of said first input frame pulse is ahead of a phase of said second input frame pulse by more than one half of one cycle said delayed pseudo clock being selected when the phase of said first input frame pulse lags behind the phase of said second input frame pulse by more than one half of one cycle, and said reference clock being selected when a phase difference between said phases of said first and second input frame pulses is within one cycle.

8. The phase locked loop control apparatus as claimed in claim 6, wherein said duty factor control means is equipped with means for outputting at least one pseudo clock by modifying the duty factor of said frequency divided clock, pseudo clock branching means for outputting branched pseudo clocks by branching respective members of said at least one pseudo clock, and phase inversion means for outputting inverted pseudo clocks by inverting the respective phases of said branched pseudo clocks.

9. The phase locked loop control apparatus as claimed in claim 6, wherein said phase locked loop control apparatus further comprises a time gate which begins time measurement starting with the time at which said line switching signal is received and outputs to said clock selection means a selection control signal which switches the selection of said clock selection means after the lapse of a stop setting period which is set in advance.

10. The phase locked loop control apparatus as claimed in claim 9, wherein said stop setting period is set at a time interval smaller than said one cycle.

11. The phase locked loop control apparatus as claimed in claim 9, wherein said duty factor control means is equipped with means for outputting at least two advanced pseudo clocks having duty clocks larger than 50% and at least two delayed pseudo clocks having duty factors smaller than 50%, and said time gate is equipped with means for outputting to said selection means a selection control signal which sequentially switches said pseudo clocks from pseudo clocks having larger duty factors to pseudo clocks having smaller duty factors after the lapse of times set in advance.

12. The phase locked loop control apparatus as claimed in claim 9, wherein said duty factor control means is equipped with means for outputting at least two pseudo clocks by modifying the duty factor of said frequency divided clock pseudo clock branching means for outputting branched pseudo clocks by branching respective members of at least two pseudo clocks, and phase inversion means for outputting inverted pseudo clocks by inverting the phase of respective members of said branched pseudo clocks, and said time gate is equipped with means for outputting to said selection means a selection control signal which switches sequentially said pseudo clocks from pseudo clocks having larger duty factors to pseudo clocks having smaller duty factors after the lapse of times set in advance.

13. The phase locked loop control apparatus as claimed in claim 4, wherein said phase locked loop control apparatus further comprises control voltage detection means for transmitting a selection control signal by detecting said control voltage, and said clock selection means includes means for selecting one of said reference clock or said pseudo clock in response to said selection control signals.

14. The phase locked loop control apparatus as claimed in claim 13, wherein said duty factor control means is equipped with means for outputting at least two advanced pseudo clocks having duty factors larger than 50% and at least two delayed pseudo clocks having duty factors smaller than 50%, and said control voltage detection means is equipped with means for outputting to said selection means said selection control signal which switches said pseudo clocks sequentially from pseudo clocks having larger duty factors to pseudo clocks having smaller duty factors in response to a reference control voltage set in advance.

15. The phase locked loop control apparatus as claimed in claim 13, wherein said duty factor control means is equipped with means for outputting at least two pseudo clocks by modifying the duty factor of said frequency divided clock, pseudo clock branching means for outputting branched pseudo clocks by branching respective members of said at least two pseudo clocks, and phase inversion means for outputting inverted pseudo clocks by inverting the respective phases of said branched pseudo clocks, and said control voltage detection means is equipped with means for outputting to said selection means a selection control signal which switches said pseudo clocks sequentially from pseudo clocks having larger duty factors to pseudo clocks having smaller duty factors in response to a reference control voltage set in advance.

16. The phase locked loop control apparatus as claimed in claim 4, wherein said phase locked loop control apparatus further comprises control voltage detection means for transmitting a selection control signal by detecting said control voltage, and said duty factor control means includes means for controlling said duty factor of said frequency divided clock in response to said selection control signal.

17. The phase locked loop control apparatus as claimed in claim 16, wherein said selection control signal is set so as to diminish said duty factor as said control voltage approaches a duty factor of 50%.

* * * * *